United States Patent [19]

Clarke

[11] Patent Number: 6,057,538

[45] Date of Patent: *May 2, 2000

[54] IMAGE SENSOR IN WHICH EACH LENS ELEMENT IS ASSOCIATED WITH A PLURALITY OF PIXELS

[75] Inventor: John A. Clarke, Carshalton, United Kingdom

[73] Assignee: U.S. Philips Corporation, New York, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/923,442

[22] Filed: Sep. 4, 1997

[30] Foreign Application Priority Data

Sep. 7, 1996 [GB] United Kingdom ................ 9618717

[51] Int. Cl.[7] ................................................ H01J 40/14
[52] U.S. Cl. ........................................ 250/208.1; 250/216
[58] Field of Search .................... 250/208.1, 216, 250/239, 214.1; 257/80–84, 430–443, 436

[56] References Cited

U.S. PATENT DOCUMENTS

| | | | |
|---|---|---|---|
| 4,410,804 | 10/1983 | Stauffer | 250/578 |
| 4,425,501 | 1/1984 | Stauffer | 250/216 |
| 4,900,914 | 2/1990 | Raff et al. | 250/216 |
| 5,286,605 | 2/1994 | Nishioka et al. | 250/208.1 |
| 5,466,926 | 11/1995 | Sasano et al. | 250/216 |
| 5,519,205 | 5/1996 | Rostoker | 250/208.1 |
| 5,696,371 | 12/1997 | Meyers | 250/216 |

*Primary Examiner*—Que T. Le
*Attorney, Agent, or Firm*—Steven R. Biren

[57] ABSTRACT

An image sensor 10 includes an array of light responsive pixels 22 and an array 30 of focusing lens elements 32. Each lens element 32 is associated with a plurality of pixels 22, so that the lens elements may be fabricated simply. The array 30 is preferably part of a non-inverting focusing arrangement, and the lens elements 32 are preferably refractive microlens elements.

10 Claims, 7 Drawing Sheets

IMAGE SENSOR IN WHICH EACH LENS ELEMENT IS ASSOCIATED WITH A PLURALITY OF PIXELS

BACKGROUND OF THE INVENTION

This invention relates to an image sensor comprising an array of light responsive pixels. The invention is particularly concerned with focusing of an image on to the array of pixels for a contact-type image sensor.

For a focused image to be formed on a pixel array of a contact-type image sensor, it is possible either to position the original document at a very short distance from the array of pixels, or to provide an optical system for focusing.

If no optical system is provided, the document to be imaged should preferably be spaced from the array of pixels by a distance which is no greater than the pitch of the pixels, for example. If there is greater spacing of the document from the array of pixels, each pixel may receive light from a greater area of the document to be imaged than is desired. As the resolution of an image sensor is increased, the image sensing pixels are arranged with progressively smaller pitch, so that for high resolution image sensors it is not possible to maintain sufficiently small spacing between the document and the array of pixels, and the need arises for an optical focusing arrangement.

U.S. Pat. No. 5,286,605 discloses a solid-state imaging device having a microlens array provided over the image sensor array, each microlens element being associated with an individual pixel of the imaging device. Of course, small microlens are required which must be accurately aligned with the pixels of the image sensor.

SUMMARY OF THE INVENTION

According to the present invention, there is provided an image sensor comprising an array of light responsive pixels, and an array of focusing lens elements associated with the array of pixels, each lens element being associated with a respective plurality of pixels.

The use of lens elements associated with a group of pixels enables an increase in the size of each lens element. The size of the lens elements may be selected such that simplified fabrication techniques may be employed for manufacturing the lens array.

The lens elements are preferably spaced apart on a common substrate, and opaque regions are then provided between the lens elements. The opaque regions ensure that all light received by the array of pixels has been focused by the lens elements.

Means may be provided for blocking the passage of light to pixels associated with one lens element from another lens element. These prevent the appearance of so-called "ghost images".

The blocking means may comprise an array of light blocking elements arranged substantially adjacent the array of pixels, the light blocking elements being arranged over the spacing between pixels.

The array of pixels preferably include an array of light shielding portions disposed over the light responsive pixels, each portion being associated with an individual pixel and including a light receiving aperture. This enables an effective reduction in the size of each pixel (which reduces the range of light detected) whilst maintaining a high pixel capacitance for image storage. In this case, the blocking means preferably comprises an array of light blocking elements arranged substantially adjacent the array of pixels, the light blocking elements being arranged over the light shielding portions.

The image sensor may comprise at least one further array of lens elements, the lens elements of the lens array each having the same optical axis as a corresponding lens element of the at least one further lens array, the lens array and the at least one further lens array together comprising a non-inverting optical system.

The use of a non-inverting optical system avoids the need for image processing which is required if the lens elements produce local inversion of portions of the image to be sensed. Furthermore, the use of a non-inverting system avoids the need for accurate alignment of the lens elements with the associated pixels. The non-inverting optical system preferably comprises three arrays of lens elements.

The lens elements may comprise microlenses, for example refractive or holographic lenses, or the lens array may comprise a planar array of graded index lenses.

The lens elements may be substantially circular converging lenses, each having a diameter between 0.1 mm and 3 mm. The resolution of the image sensor will then determine the number of pixels associated with each lens element.

BRIEF DESCRIPTION OF THE DRAWING

The invention will now be described by way of example, with reference and as shown in the accompanying drawings in which.

DESCRIPTION OF THE PREFERRED EMBODIMENTS

Figure 1:
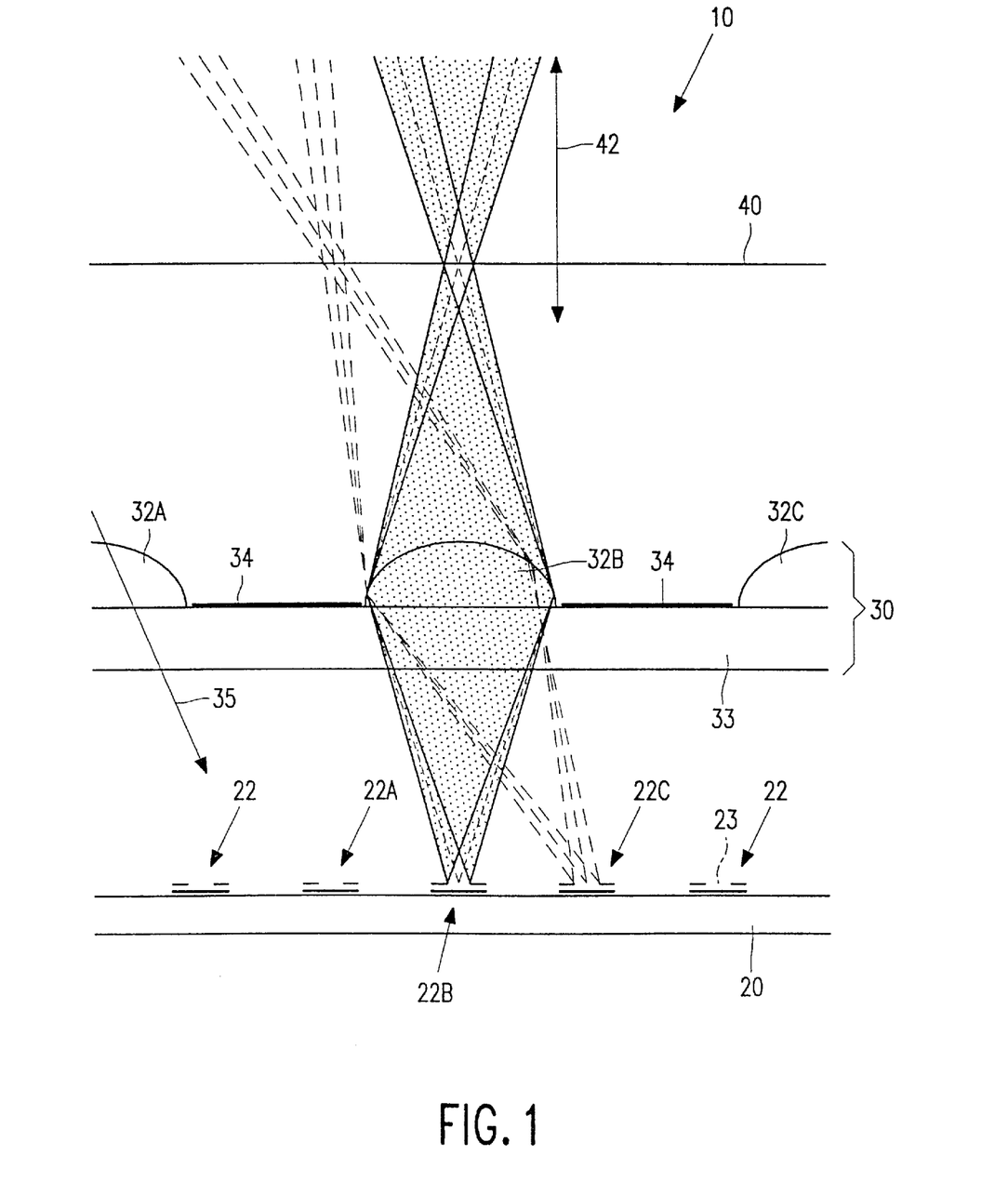
FIG. 1 shows an image sensor according to the invention having an optical focusing arrangement.

FIG. 1 shows an image sensor 10 comprising a substrate 20 which carries a plurality of image sensing pixels 22 and an optical focusing arrangement 30 which provides a focused image of an original 40 on to the pixels 22. In accordance with the invention, the optical focusing arrangement 30 comprises a plurality of lens elements 32 (three of which 32A, 32B, 32C are shown in FIG. 1) each associated with a respective group of pixels 22.

Contact-type image sensors are known which employ an optical focusing arrangement in the form of an array of microlens elements formed over the image sensing pixels, and with an individual microlens element associated with each image sensing pixel. This arrangement requires each microlens to occupy an area which is no greater than the area associated with an individual pixel. The reduction in pixel size required for high resolution imaging applications gives rise to very small pixel dimensions, and the consequent need for very small microlenses. For example, image sensing applications may require a resolution of 600 dpi (dots per inch) which gives rise to a pixel pitch of 42 μm (micrometres). Known methods exist for forming shaped lens elements of diameter as low as 50 μm from reformed thermoplastic resin. For this purpose, a substrate of the lens array (usually glass) is coated with a thermoplastic resin layer, which may be applied by means of spin coating. Subsequent patterning of the thermoplastic resin may be carried out by means of photolithography. This gives a thermoplastic resin layer having discrete portions, each corresponding to an individual microlens, in the desired positions. Thermal reflow of the resin layer at a predetermined temperature causes the thermoplastic resin to reform in a convex lens shape. However, as the size of the microlens elements is reduced, it becomes increasingly difficult to control the power of each lens element and the cost of producing the lens array increases.

By associating a group of pixels 22 with each lens element 32 according to the present invention, it becomes possible to increase the size of each lens element to enable less expensive fabrication techniques. The lens elements may, for example, be formed by known moulding techniques. Thus, a mould may be formed by creating indentations in a metal plate and this mould may be used to make plastic refractive lenses on a glass substrate or a plastic sheet.

The image sensing pixels 22 shown in FIG. 1 are arranged in a two dimensional array. The array may be of known configuration and may, for example, comprise thin film semiconductor layers deposited in appropriate patterns on the substrate 20 to define the array of pixels 22. Each pixel preferably includes a photodiode, and various photodiode pixel arrangements will be known to those skilled in the art. Alternatively, the array of image sensing pixels 22 may instead form part of an electrostatic imaging system, or the pixels 22 may comprise charge coupled devices.

Each image sensing pixel 22 may include an array of light shielding portions disposed over the pixels, each portion being associated with an individual pixel and having a sensor aperture 23 enabling light to pass to a portion of the pixel 22. In this way, a small light receptive area of the sensor is obtained while maintaining the large capacitance needed to store the signal. The use of a small light receptive area restricts the spread of angles of incidence over which the pixels receive light, which assists in reducing the possibility of light from one imaging area being focused on to two or more adjacent image sensing pixels.

The focusing arrangement 30 represented in FIG. 1 comprises a single array of microlens elements 32 which, as described above, may be formed by conventional moulding techniques. Instead, holographic lenses may be employed or the array of microlens elements may comprise a planar array of graded index lenses. In the representation of FIG. 1, each microlens element 32 is shown to be associated with three pixels 22A, 22B, 22C. In two dimensions, each microlens element is therefore associated with a group of nine pixels, arranged in a 3×3 sub-array. In practice, each microlens element 32 may be associated with a much greater number of image sensor pixels, for example of the order of 100 or more, so that the fabrication of the microlens array becomes less complicated. A typical pitch of 0.1 mm to 3 mm is provided for the microlens elements, and the resolution of the image sensor 10 will then determine the number of image sensing pixels associated with an individual microlens element 32.

In the example of FIG. 1, each lens element 32 forms an inverted image of a portion of the original 40. This is illustrated in FIG. 1 using light envelopes associated with each pixel 22. When each microlens element is associated with an individual pixel, as is conventional, the local inversion caused by the individual microlens elements 32 does not distort the image formed on the array of pixels 22. However, when each microlens element 32 is associated with a group of pixels, then discontinuities occur at the boundary between one group of pixels (associated with one lens element) and the next group (associated with an adjacent lens element). The use of the optical focusing arrangement 30 shown in FIG. 1 therefore requires processing of the signals received by the pixels in order to reconstruct an image of the original 40. Although such image processing is possible, the use of the optical system 30 of FIG. 1 also requires a knowledge of exactly which pixels are associated with each lens element 32, so that the correct signal processing can take place. When each lens element 32 is associated with a large number of very small pixels, the accuracy with which the array of lens elements 32 must be positioned is undesirably great.

The above disadvantages of the system shown in FIG. 1 may be overcome by using a non-inverting optical focusing arrangement, as will be described in further embodiments.

Irrespectively of the exact configuration of the optical focusing arrangement 30, the arrangement 30 provides a depth of focus 42 within which the original 40 can be positioned so as to be focused on the image sensing pixels 22. This depth of focus 42 preferably has a sufficient range to enable local deformation of the original 40 without the image becoming out of focus, and is also preferably spaced from the optical focusing arrangement 30 by a sufficient distance to enable an imaging window to be positioned over the focusing arrangement 30 so as to provide a surface on which the original 40 is positioned. Various spacing layers may be appropriate to ensure correct relative positioning of all components of the image sensor 10.

The focusing arrangements 30 has opaque portions 34 disposed between the lens elements 32 which ensure that all light received from the original 40 passes through the lens elements 32 and can not pass directly through the substrate 33 of the lens array. The lens elements 32 may alternatively abut one another, for example forming a honeycomb structure. However, circular lens elements may be preferred, in which case the spacing between the lens elements 32 is provided with blocking material 34, for example by a printing process. It may also be desirable to employ lens elements 32 which are smaller than the maximum possible size if a shorter focal distance is desired, so as to reduce the overall thickness of the image sensor 10.

In addition to the light blocking material 34, it is also desirable to employ measures for eliminating so-called "ghost images" which result from light falling on pixels 22 from lens elements 32 associated with a different group of pixels. For example, in FIG. 1 arrow 35 represents the possible passage of light to pixel 22A (which is associated with lens element 32B) but which has passed through lens element 32A. Various measures may be employed for eliminating ghost images, in the form of light blocking material and/or arrays of apertures. Some examples of the possibilities available are described below.

Figure 2:
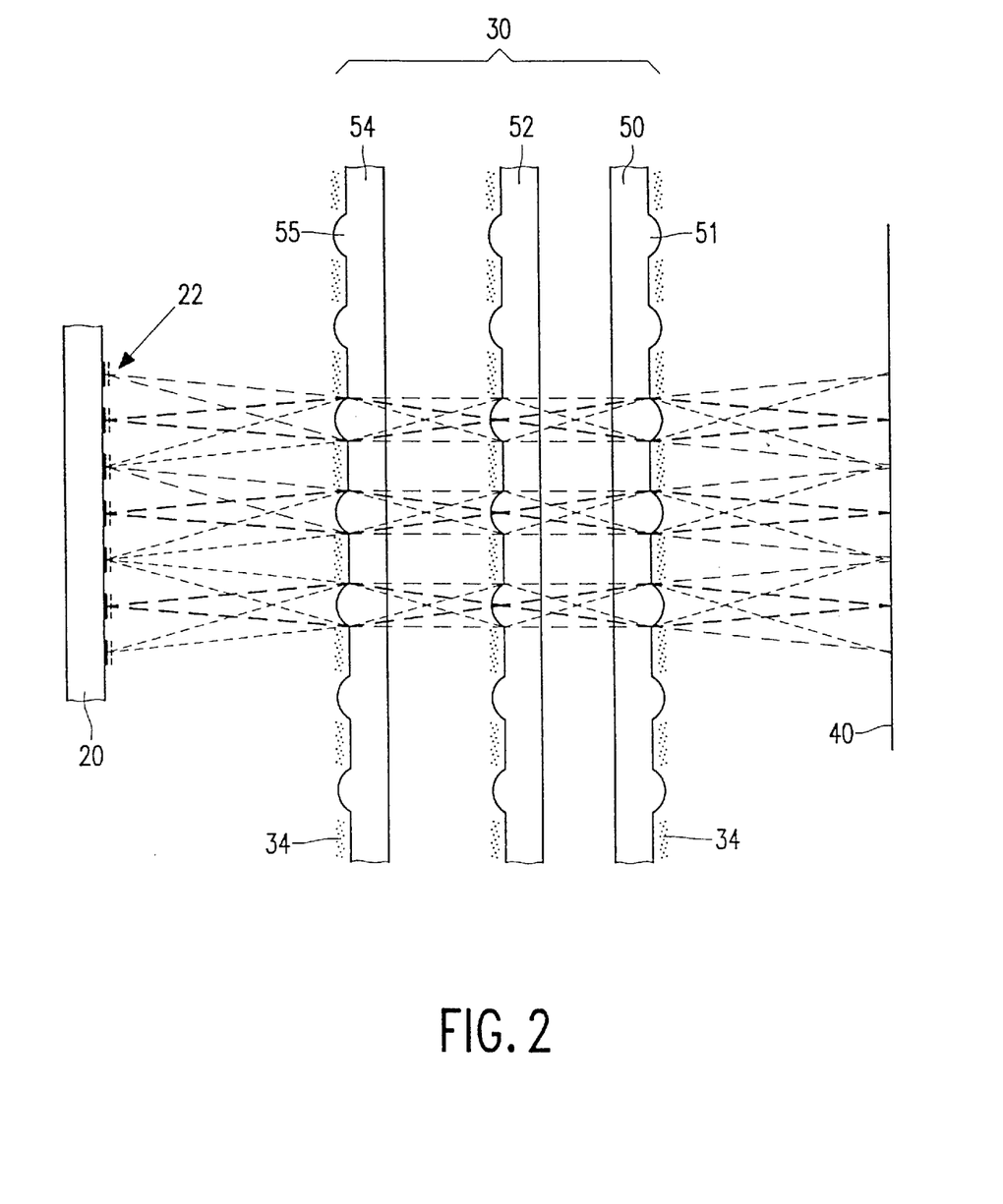
FIG. 2 shows an image sensor according to the invention with a first alternative optical focusing arrangement.

As described above, it may be preferred to employ a non-inverting optical focusing arrangement 30 and one possibility is represented in FIG. 2. The same reference numerals have been used to denote similar parts to FIG. 1. For the purposes of a clear representation, each lens element of the focusing arrangement 30 is again shown to be associated with a line of three pixels 22 (and therefore a sub-array of nine pixels).

In FIG. 2, the optical focusing arrangement 30 comprises three lens arrays 50, 52, 54 which together form a non-inverted image of the original 40. An inverted image is formed by one array 50, and this array is re-imaged by a subsequent array to form a non-inverted image. The purpose of the central lens array is described below. For any particular spacing of the lens arrays, there is an associated required position of the original and of the array of pixels for focusing to take place. This will be evident to those skilled in the art. As a result, the spacing of the original 40 from the focusing arrangement 30, the spacing between the lens arrays 50, 52, 54, and the spacing of the array of sensing pixels 22 from the focusing arrangement 30 are each selected in combination to arrive at a practical implementation of the invention.

During operation of the image sensor shown in FIG. 2, each lens element 51 closest to the original receives light from a number of regions of the original. The lens array 50 of lens elements 51 forms an inverted image of these regions close to lens array 52. Each lens element 55 in the lens array 54 then forms a non-inverted image on the array of image sensing pixels 22. The purpose of the lens array 52 is to prevent light spreading. If the lens array 52 were omitted, light from the lens elements 51 could reach several of the lens elements 55. Other lens arrangements will be apparent to those skilled in the art.

In FIG. 2, the lens arrays 50, 52, 54 are shown on separate substrates. It will be apparent that the arrays 50 and 52 could be formed on opposite sides of a single substrate of appropriate thickness. Alternatively, by reversing array 52, arrays 52 and 54 could be formed on a single substrate.

Figure 3:
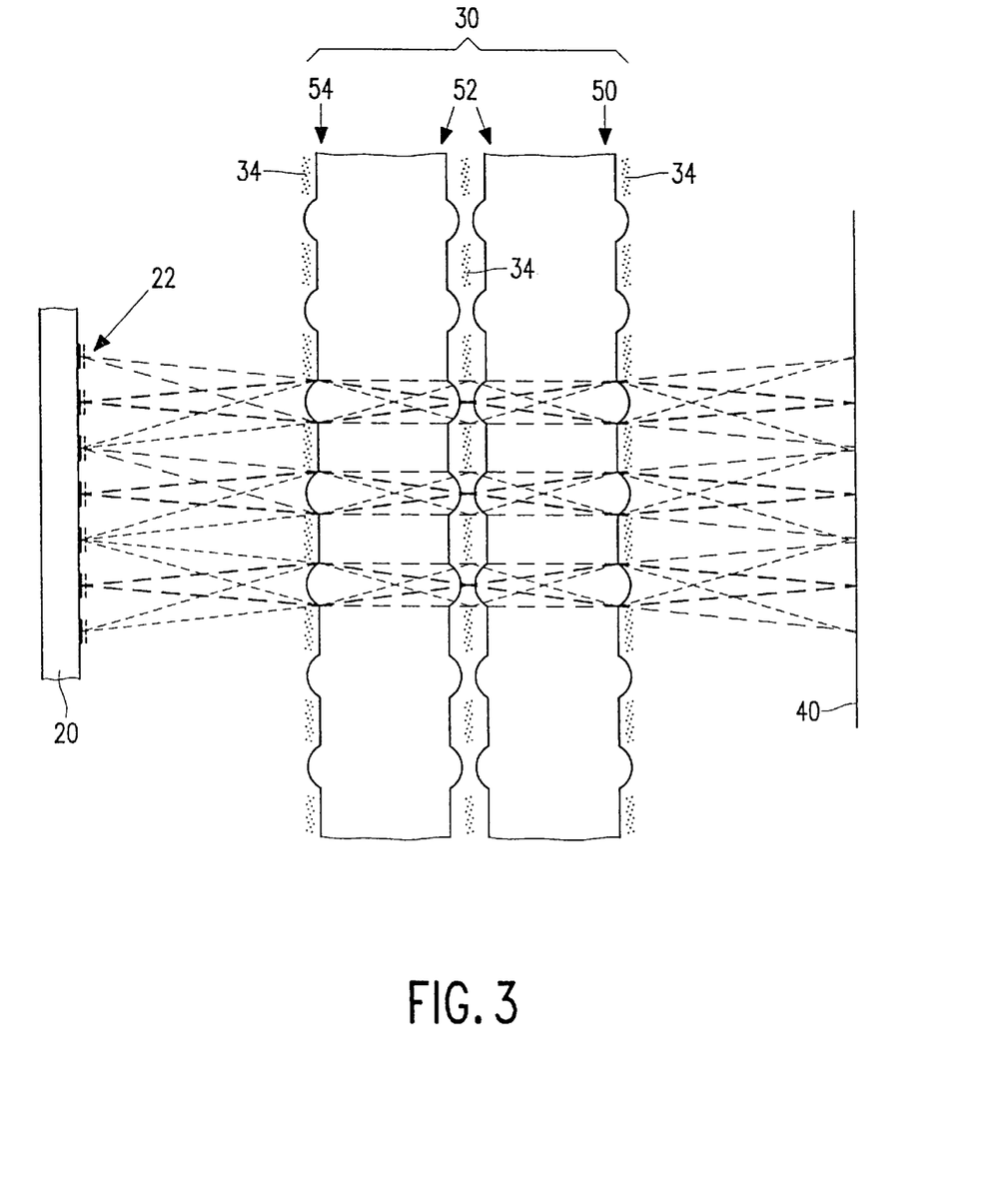
FIG. 3 shows an image sensor with a second alternative optical arrangement.

Yet another alternative is for the power in the lens array 52 to be divided between two arrays, each of which is then formed on the other side of either array 50 or array 54, as shown in FIG. 3.

In both FIGS. 2 and 3, light blocking material 34 is represented between the lens elements of each lens array 50, 52, 54, and having the same function as the blocking material 34 explained with reference to FIG. 1.

Figure 4:
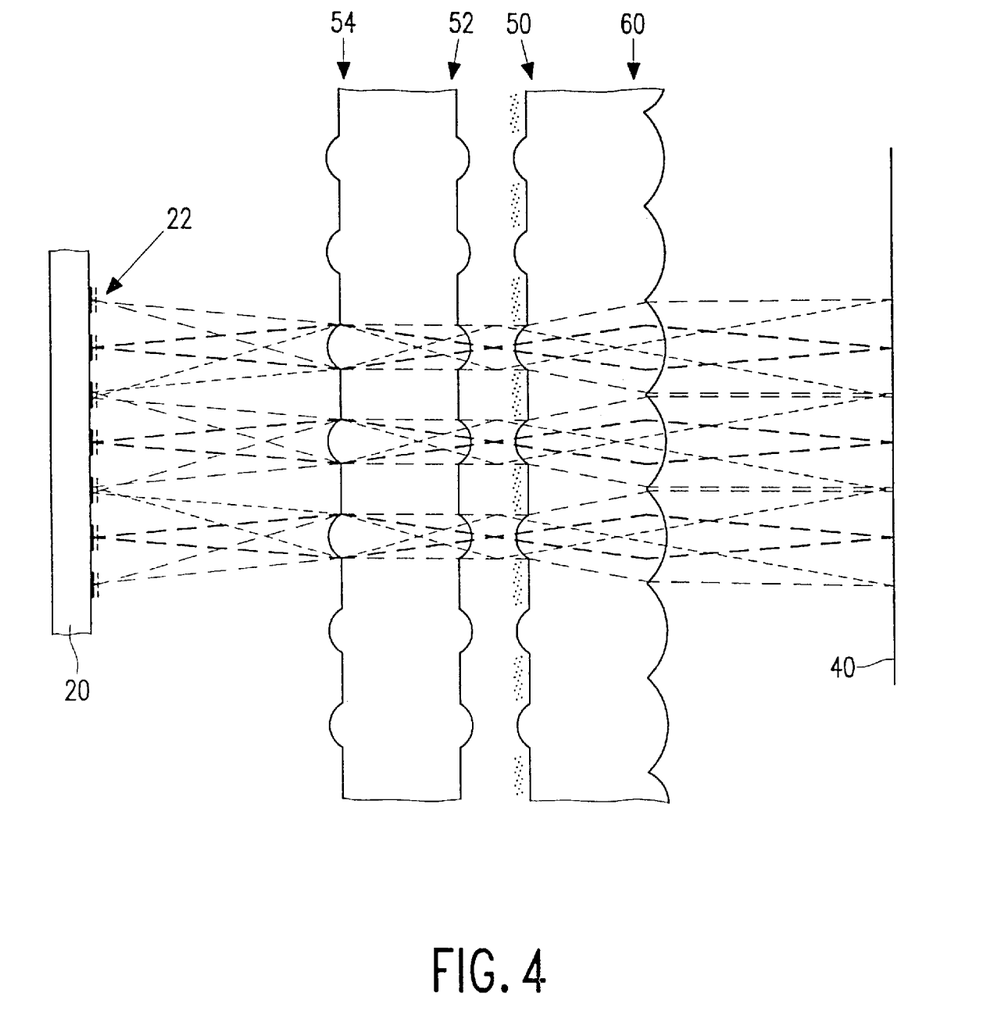
FIG. 4 shows an image sensor with a third alternative optical focusing arrangement.

A further alternative for the optical focusing arrangement 30 is shown in FIG. 4, and uses an additional microlens array 60 between the original and the remainder of the focusing arrangement 50, 52, 54. The purpose of the additional lens array 60 is to bend the rays travelling to off-axis pixels from regions of the original, so that they are closely parallel to the optical axis when near the original 40. If the original 40 is then slightly out of focus, the error in its apparent position will be minimized, thereby effectively increasing the depth of focus.

Figure 5A:
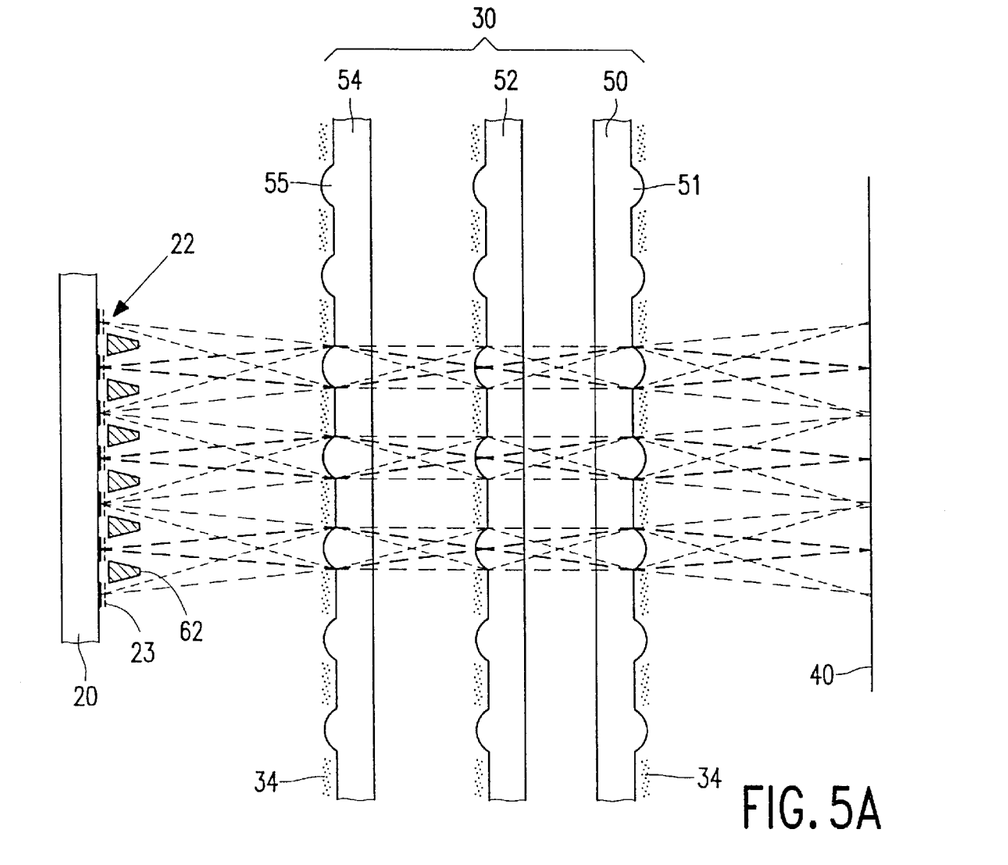
FIG. 5 shows an image sensor according to the invention with an optical focusing arrangement corresponding to that of FIG. 3, the image sensor further comprising a light blocking arrangement.
Figure 5B:
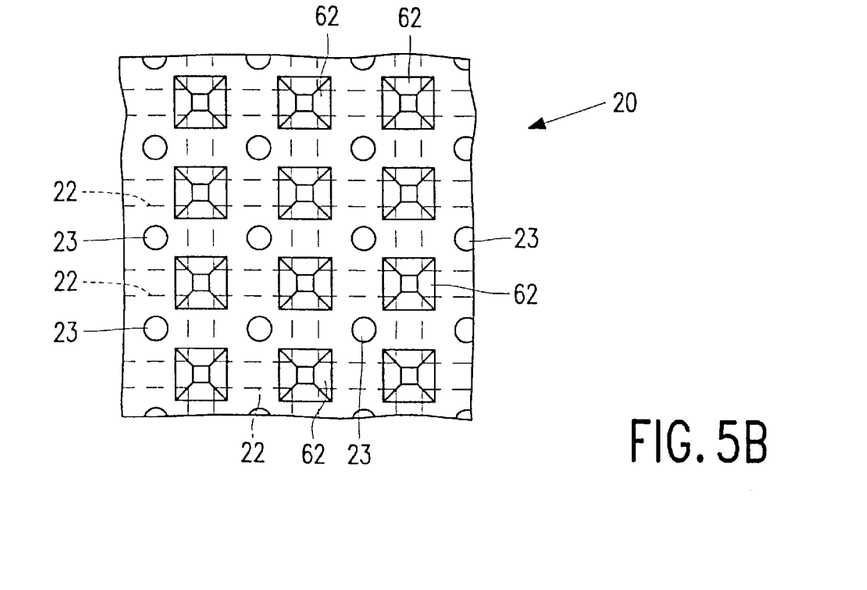

As described above, additional measures may be desired to prevent the formation of so-called "ghost images", by blocking the passage of light represented by arrow 35 in FIG. 1. Of course, the passage of light from a lens element 32 to the associated pixels 22 must not be prevented, and FIG. 5 part A shows one possible arrangement of light blocking material 62 forming ghost image attenuators. As shown, the light blocking material 62 is provided over the image sensing pixels 22 between the apertures 23. The light blocking material 62 is arranged as a plurality of stacks which taper away from the image sensing pixels, so that they do not interfere with the passage of light from the lens elements to the associated pixels. The exact form of the stacks of light blocking material and their positions will depend upon the optical arrangement. The stacks may, for example, be arranged as a regular array with the stacks offset (in both orthogonal axes within the pixel array) from the pixels 22 by half of the pixel pitch. This is shown in FIG. 5 part B. Each stack is shown as a truncated square-based pyramid.

Figure 6:
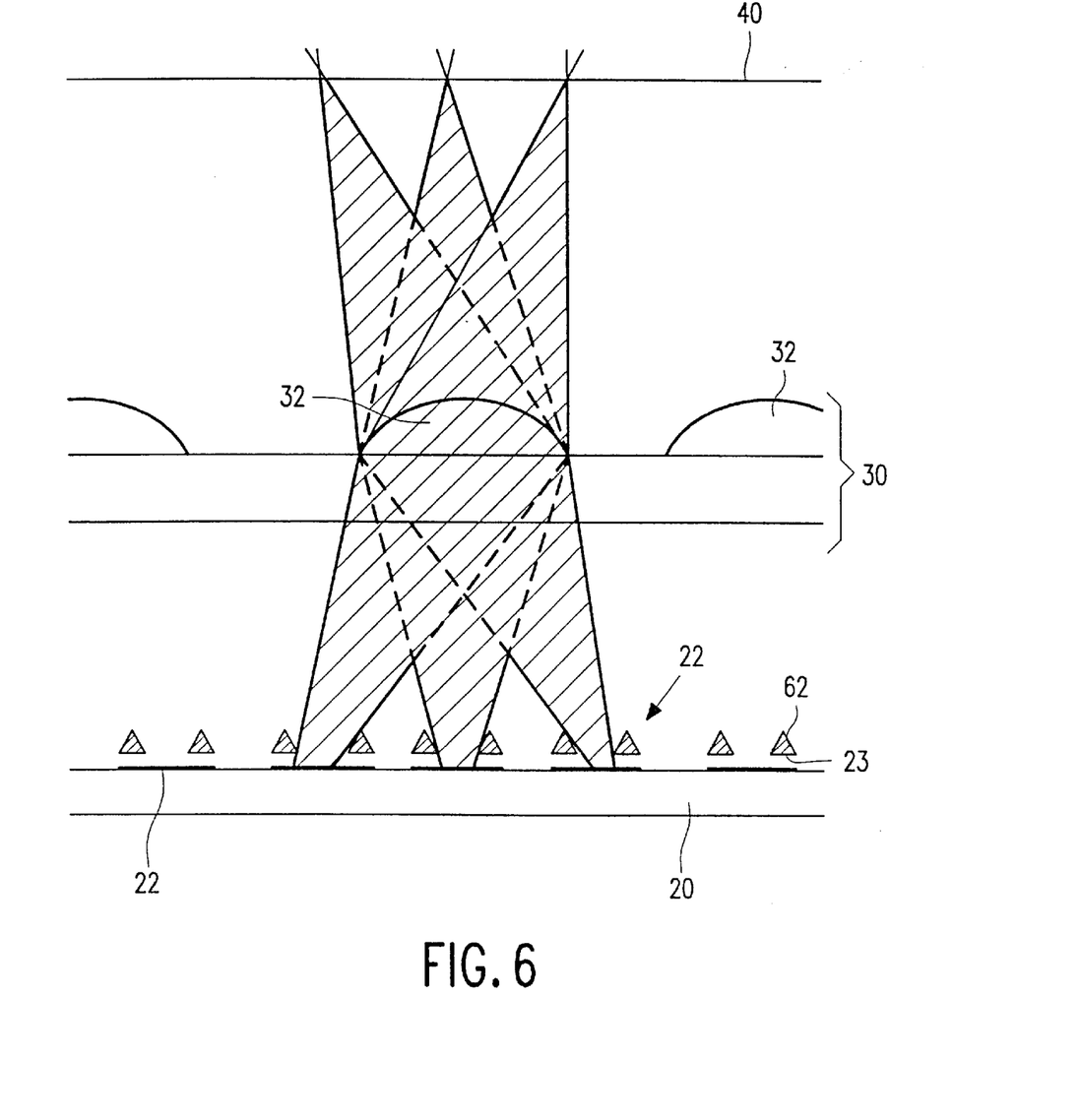
FIG. 6 shows an image sensor according to the invention with an optical focusing arrangement corresponding to that of FIG. 1, the image sensor further comprising a first alternative light blocking arrangement.

A modification to the arrangement of FIG. 5 is shown in FIG. 6 and may be employed when illumination of the document to be imaged is carried out through the substrate 20 of the image sensor 10.

In FIG. 6, the light blocking material 62 is arranged over each image sensing pixel 22 in pyramids disposed over the blocking portions of the sensor apertures 23. In this way, the light blocking material 62 does not prevent the passage of light from beneath the substrate 20 to the optical focusing arrangement 30 through the spaces between sensor pixels 22.

Figure 7:
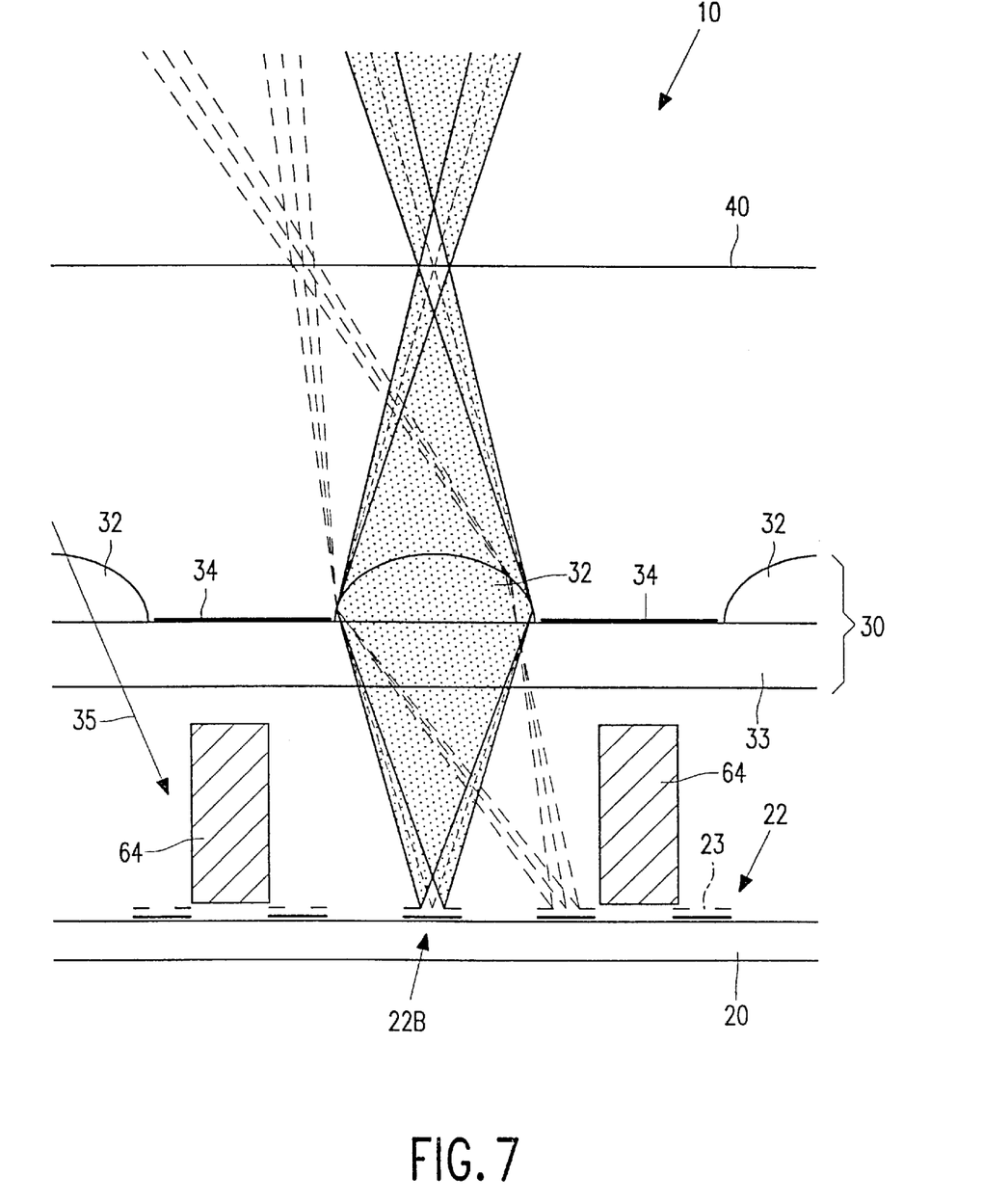
FIG. 7 shows a second alternative light blocking arrangement.

A further alternative is shown in FIG. 7, in which a lattice of light blocking walls 64 surrounds each group of pixels, the walls being disposed over the spacing between pixels of different groups, the lattice blocking the passage of light from adjacent lens elements. The configuration of walls 64 will depend upon the shape of the pixel groups, and may, for example, form a hexagonal honeycomb structure, or a square or rectangular lattice.

From reading the present disclosure, other modifications will be apparent to persons skilled in the art. Such modifications may involve other features which are already known in the design and use of electrical or electronic circuits and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation of one or more of those features which would be obvious to persons skilled in the art, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. An image sensor comprising an array of light-responsive pixels, and an optical focusing arrangement comprising an array of focusing lens elements associated with the array of pixels, wherein a pitch of said lens elements is at least about twice a pitch of said pixels and the array of focusing lens elements is arranged with respect to the array of pixels such that each lens element is optically associated with a respective plurality of pixels, whereby light passing through each said lens element is provided to, and focused on, each of its said respective associated plurality of pixels.

2. An image sensor as claimed in claim 1, wherein the lens elements are spaced apart on a common substrate and opaque regions are provided between the lens elements.

3. An image sensor as claimed in claim 1, further comprising means for blocking the passage of light to pixels associated with one lens element from another lens element.

4. An image sensor as claimed in claim 3, wherein the means for blocking comprises an array of light blocking elements arranged substantially adjacent the array of pixels, the light blocking elements being arranged over the spacing between pixels associated with adjacent lens elements.

5. An image sensor as claimed in claim 4, wherein the light blocking elements are arranged over the spacing between all pixels.

6. An image sensor as claimed in claim 3, wherein the array of pixels includes an array of light shielding portions disposed over the light responsive pixels, each portion being associated with an individual pixel and including a light receiving aperture.

7. An image sensor as claimed in claim 6, wherein the means for blocking comprises an array of light blocking elements arranged substantially adjacent the array of pixels, the light blocking elements being arranged over the light shielding portions.

8. An image sensor as claimed in claim 1, further comprising at least one further array of lens elements, the lens elements of the lens array each having the same optical axis as a corresponding lens element of the at least one further lens array, the lens array and the at least one further lens array together comprising a non-inverting optical system.

9. An image sensor as claimed in claim 8, wherein the non-inverting optical system comprises three arrays of lens elements.

10. An image sensor as claimed in claim 1, wherein the lens elements comprise substantially circular converging lenses having a diameter between 0.1 mm and 3 mm.

* * * * *